(12) United States Patent
Lin et al.

(10) Patent No.: US 6,187,625 B1
(45) Date of Patent: Feb. 13, 2001

(54) METHOD OF FABRICATING CROWN CAPACITOR

(75) Inventors: Wei-Ray Lin, Taipei; Hsien-Wen Liu, Taoyuan Hsien, both of (TW)

(73) Assignee: Nanya Technology Corporation (TW)

( * ) Notice: Under 35 U.S.C. 154(b), the term of this patent shall be extended for 0 days.

(21) Appl. No.: 09/458,091

(22) Filed: Dec. 10, 1999

(30) Foreign Application Priority Data

Mar. 5, 1999 (TW) .................................................. 88103488

(51) Int. Cl.⁷ .............................................. H01L 21/8242
(52) U.S. Cl. .......................... 438/253; 438/254; 438/397; 438/396; 438/631; 438/649
(58) Field of Search ..................... 438/253, 239, 438/254, 255, 256, 396, 397, 631, 649

(56) References Cited

U.S. PATENT DOCUMENTS

| | | | |
|---|---|---|---|
| 5,021,357 | 6/1991 | Taguchi et al. | 437/52 |
| 5,104,821 | 4/1992 | Choi et al. | 437/52 |
| 5,185,282 | 2/1993 | Lee et al. | 437/47 |
| 5,266,512 | * 11/1993 | Kirsch | 437/52 |
| 5,399,518 | * 3/1995 | Sim et al. | 437/52 |
| 5,652,165 | * 7/1997 | Lu et al. | 437/52 |
| 5,780,338 | * 7/1998 | Jeng et al. | 438/253 |
| 5,789,291 | * 8/1998 | Sung | 438/254 |
| 5,972,769 | * 10/1999 | Tsu et al. | 438/396 |

* cited by examiner

*Primary Examiner*—Matthew Smith
*Assistant Examiner*—V. Yevsikov
(74) *Attorney, Agent, or Firm*—George T. Marcou; Kilpatrick Stockton LLP

(57) ABSTRACT

A method of fabricating a crown capacitor comprises first providing a substrate having a transistor, constituted by at least one diffused region, formed thereon and overlaid by a first insulating layer. Bit lines are formed in the first insulating layer. A first masking layer and a second insulating layer are sequentially formed over the substrate. The second insulating layer, the first masking layer and the first insulating layer are patterned to form a contact hole that exposes the diffused region. A second masking layer is conformally formed and etched back to form masking spacers on the sidewalls of the contact hole. The second insulating layer is removed. A first conductive layer is conformally formed over the first masking layer and extending to the surface of the masking spacers and the bottom of the contact hole. A third insulating layer is formed over the first conductive layer and fills the contact hole. The third insulating layer and the first conductive layer are patterned to the first masking layer leaving portions of the third insulating layer with vertical sidewalls over the contact hole. A second conductive layer is conformally formed and etched back to form conductive spacers on the sidewalls of the third insulating layer. The third insulating layer is removed to expose the conductive spacers and the first conductive layer as a bottom electrode. A capacitor dielectric layer and a top electrode are sequentially formed on the bottom electrode.

23 Claims, 11 Drawing Sheets

METHOD OF FABRICATING CROWN CAPACITOR

BACKGROUND OF THE INVENTION

1. Field of the Invention

The present invention relates to a method of fabricating a stack capacitor of a dynamic random access memory (DRAM) cell, and more particularly to the fabrication of a stack crown capacitor.

2. Description of the Prior Art

A DRAM cell comprises a metal-oxide-semiconductor field effect transistor (MOSFET) and a capacitor that are built in a semiconductor silicon substrate. There is an electrical contact between the drain of a MOSFET and the bottom storage electrodes of the adjacent capacitor, forming a memory cell of the DRAM device. A large number of memory cells make up the cell arrays which are combined with the peripheral circuit to produce DRAMs.

In recent years, the sizes of the MOSFETs and capacitors have become smaller; thus, the packing densities of these DRAM devices have increased considerably. For example, a number of semiconductor manufacturing companies have already begun mass production of 64 Mbit DRAMs. These high density DRAMs offer the advantages of longer refresh time as well as less power consumption. However, as the sizes of the capacitors become smaller, which the capacitance values of the capacitors are decreasing, which reduces the signal to noise ratio of the DRAM circuits and causes performance problems. The issue of maintaining or even increasing the surface area of the bottom storage electrodes or reducing the thickness of the dielectric layer has become particularly important as the density of the DRAM arrays continues to increase for future generations of memory devices.

There are two ways to deal with this problem: increasing the thickness of the bottom storage electrodes or increasing the surface area of the capacitors. Since increasing the thickness of the bottom storage electrodes is very difficult in terms of precision photolithography and etching process control, increasing the capacitor surface area is an easier approach when the capacitor is used to fabricate 16 Mbit DRAMs and higher. Various shapes of capacitor structures have been used to address this issue. U.S. Pat. No. 5,185,282 to Lee et al. of Hyundai Electronics (the entire disclosure of which is herein incorporated by reference) provides a method of fabricating cup-shaped capacitor bottom storage electrodes. Another U.S. Pat. No. 5,021,357 to Taguchi et al. of Fujitsu (the entire disclosure of which is herein incorporated by reference) discloses a method of fabricating fin structure capacitor electrode. U.S. Pat. No. 5,104,821 to Choi et al. of Samsung (the entire disclosure of which is herein incorporated by reference) provides a method of fabricating cylinder-shaped (or crown-shaped) capacitor structure. These capacitor structures can effectively increase the capacitance values of the capacitors; however, these processes are too complicated and highly sensitive and therefore impractical in DRAM mass-production.

FIG. 1A illustrates a method of manufacturing a DRAM crown capacitor according to the conventional method, wherein a semiconductor substrate 100 is provided. Using a LOCOS Oxidation process, form a field insulating layer (not shown) on the substrate 100. The field insulating layer isolates each Active Area. Thereafter, using ordinary semiconductor process, such as deposition, photolithography and ion implantation, form the source/drain region 110, the transistor (not shown), the bit line 120 and the first insulating layer 115. The transistor is composed of a gate (not shown) and diffusion areas, such as the source/drain regions 110. The first insulating layer 115 isolates the bit line 120 and the first conductive layer 125 that will be deposited later. In the next step, a first masking layer 122 is formed on the surface of the insulating layer 115. Using a photolithography process and etching steps, pattern the masking layer 122 and the insulating layer 115 to form a contact hole 124 which exposes the surface of the diffusion areas 110. Note, due to the misalignment, a short between the contact hole 124 and the bit line 120 can easily occur in this step. Deposit a first conductive layer 125 on the surface of the first masking layer 122, and conformally fills the contact hole 124. Then, deposit a second insulating layer 130 on the first conductive layer 125.

As shown in FIG. 1B, the second insulating layer 130 is then patterned leaving portions 130a having essentially vertical sidewalls over the contact hole 124. Conventional photolithography procedures and anisotropic etching are used to pattern the second insulating layer 130 to the surface of the first conductive layer 125.

As shown in FIG. 1C, a second conductive layer 140 is then conformally deposited over the first conductive layer 125 and the patterned second insulating layer 130a. As shown in FIG. 1D, the second conductive layer 140 is anisotropically plasma etched back to form first conductive spacers 140a and 140b on the sidewalls of the patterned second insulating layer 130a.

Now, as shown in FIG. 1E, a second masking layer 145 is conformally deposited over the patterned second insulating layer 130a, the first conductive spacers 140a, 140b and the first conductive layer 125.

As shown in FIG. 1F, the second masking layer 145 is anisotropically plasma etched back to form the first insulating spacers 145a and 145b on the sidewalls of the first conductive spacers 140a, 140b.

As shown in FIG. 1G, deposit a third conductive layer 150 over the surface of the first conductive layer 125, the patterned second insulating layer 130a, the first conductive spacers 140a and 140b, and the first insulating spacers 145a and 145b.

As shown in FIG. 1H, the third conductive layer 150 is anisotropically plasma etched back to form the second conductive spacers 150a and 150b on the sidewalls of the first insulating spacers 145a, 145b. The etching is continued to remove the first conductive layer 125 and down to the first masking layer 122 adjacent to a capacitor area 180 to electrically isolate individual bottom electrodes.

Finally, as shown in FIG. 1I, the patterned second insulating layer 130a and the masking spacers 145a, 145b are then selectively removed by etching to form a bottom electrode having a double-crown shape formed from the first conductive spacers 140a and 140b, the second conductive spacers 150a and 150b, and the first conductive layers 125a that electrically connect the diffusion areas 110.

Then, the stacked capacitor is completed by forming a thin capacitor dielectric layer 160 on the bottom electrodes, and forming top electrode comprising a fourth conductive layer 170. Layer 160 is a high-dielectric-constant layer. This layer is typically composed of layers of $Si_3N_4/SiO_2$ (NO), or layers of $SiO_2/Si_3N_4/SiO_2$ (ONO). The conventional DRAM crown capacitor manufacturing process is complicated and costly. It includes depositing three conductive layers and two sets of conductive sidewalls spacers to form the bottom storage electrodes. Consequently, the increase of the surface area of the stack crown capacitor is limited. Moreover, in the step of forming a contact hole to expose the surface of the source/drain region, there is no protection between the bit line and the contact hole. When misalignment occurs in photolithography process, the bit line is easily damaged or shorted with the first conductive layer 125 in the contact hole (i.e., the contact plug) when performing the etching process. Then the semiconductor device will easily suffer from data access errors.

SUMMARY OF THE INVENTION

Accordingly, the primary object of the present invention is to provide a method of fabricating a stack crown capacitor by using only two conductive layers, one conductive layer less than the conventional DRAM stack crown capacitor process.

It is the object of the present invention to provide a method of fabricating a stack crown capacitor to enlarge the surface area of the bottom electrode of the capacitor. Since the size of DRAM device is smaller, the capacitor has to be over the bit lines. As a result, the aspect ratio of the contact hole becomes larger. If the bottom electrode can utilize the sidewalls and the bottom of the contact hole, the surface area of the bottom electrode of a capacitor will be larger.

Another object of the present invention is to provide a method of fabricating a stack crown capacitor by using the second masking layer to protect the contact hole (i.e., the contact plug) to prevent shorting with the bit line should misalignment occur in photolithography processes.

A method of fabricating a crown capacitor according to an embodiment of the present invention comprises first providing a substrate having a transistor, constituted by at least one diffused region, formed thereon and overlaid by a first insulating layer. Bit lines are formed in the first insulating layer. A first masking layer and a second insulating layer are sequentially formed over the substrate. The second insulating layer, the first masking layer and the first insulating layer are patterned to form a contact hole that exposes the diffused region. A second masking layer is conformally formed on the surface of the second insulating layer and extending to the sidewalls and the bottom of the contact hole. The second masking layer is etched back to form masking spacers on the sidewalls of the contact hole. The second insulating layer is removed. A first conductive layer is conformally formed over the first masking layer and extending to the surface of the masking spacers and the bottom of the contact hole. A third insulating layer is formed over the first conductive layer and fills the contact hole. The third insulating layer and the first conductive layer are patterned to the first masking layer leaving portions of the third insulating layer with vertical sidewalls over the contact hole. A second conductive layer is formed over the third insulating layer and the first masking layer. The second conductive layer is etched back to form conductive spacers on the sidewalls of the third insulating layer. The third insulating layer is removed to expose the conductive spacers and the first conductive layer as a bottom electrode. A capacitor dielectric layer and a top electrode are sequentially formed on the bottom electrode.

BRIEF DESCRIPTION OF THE DRAWINGS

The accompanying drawings form a material part of this description, in which.

DETAILED DESCRIPTION OF THE PREFERRED EMBODIMENT

Figure 1A:
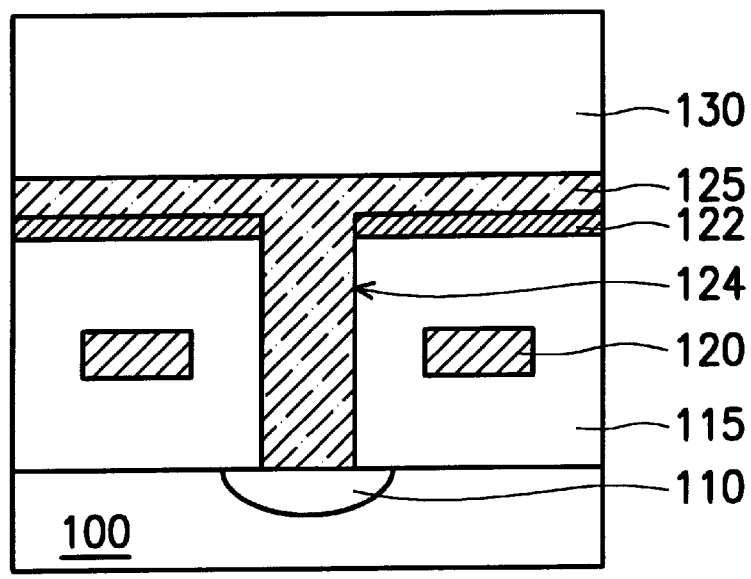
FIGS. 1A through 1I show schematic cross-sectional views of a partially fabricated integrated circuit structure at successive stages in forming a crown capacitor of a DRAM cell of the prior art.
Figure 1B:
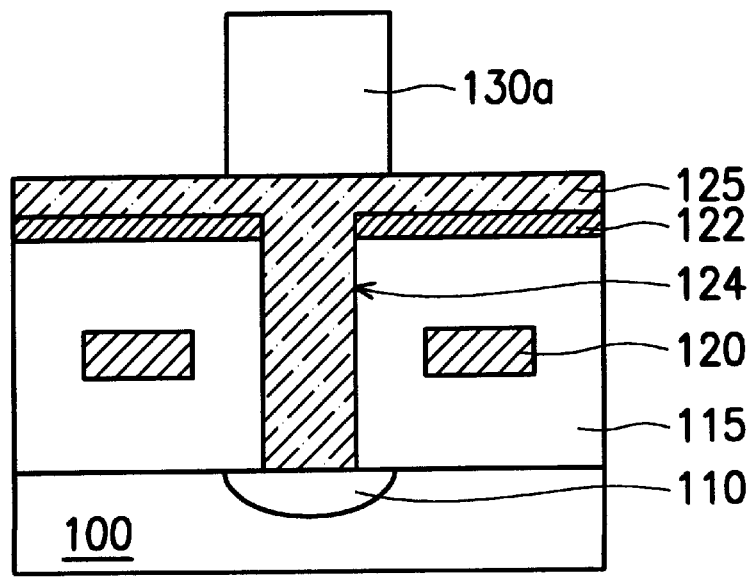
Figure 1C:
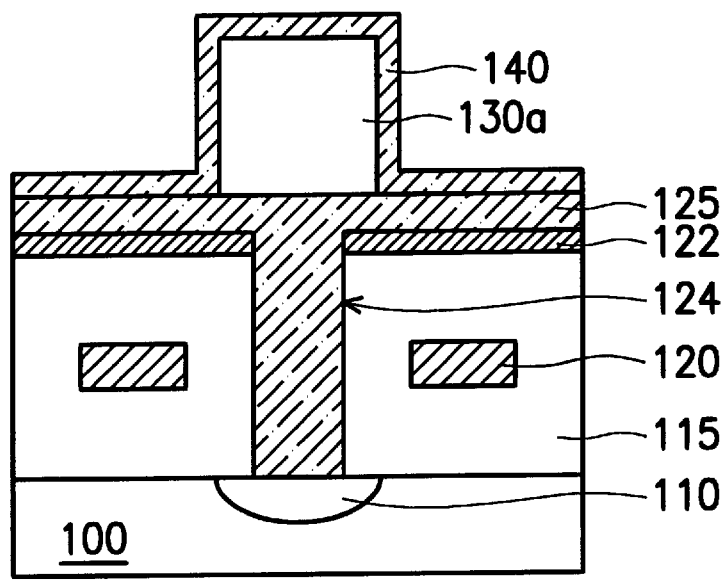
Figure 1D:
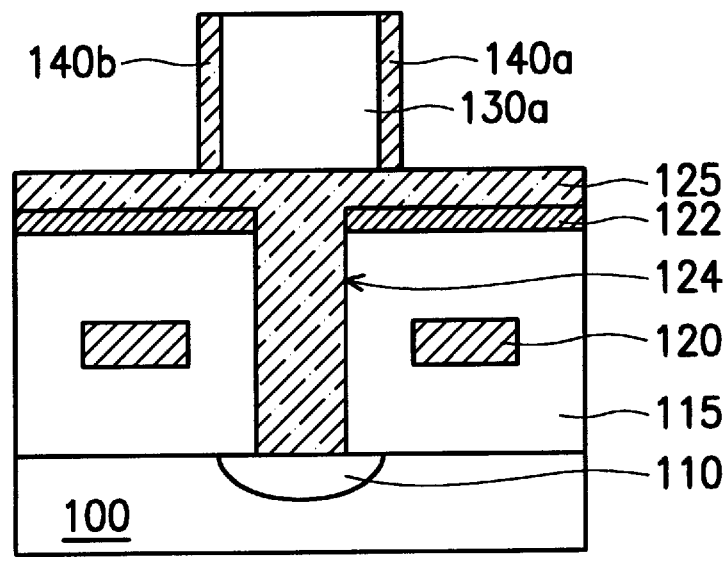
Figure 1E:
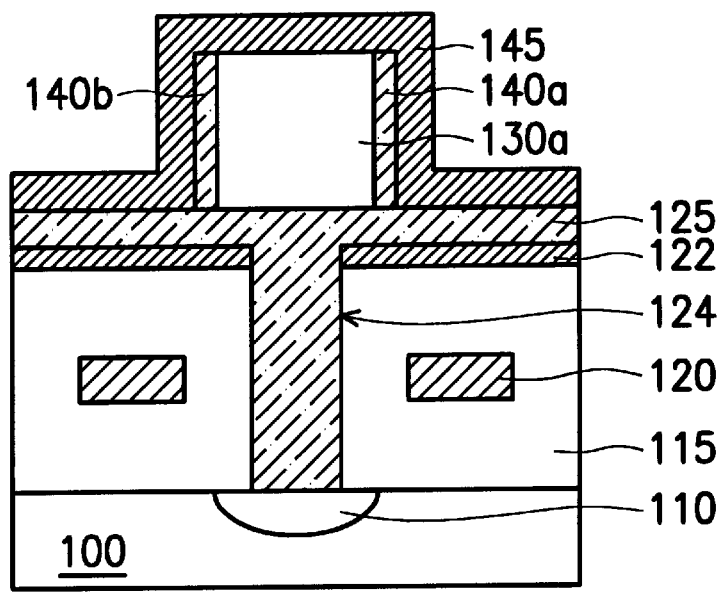
Figure 1F:
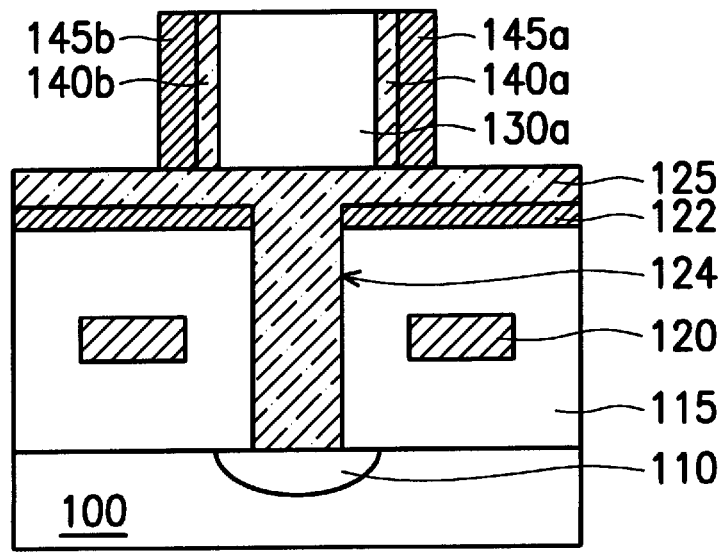
Figure 1G:
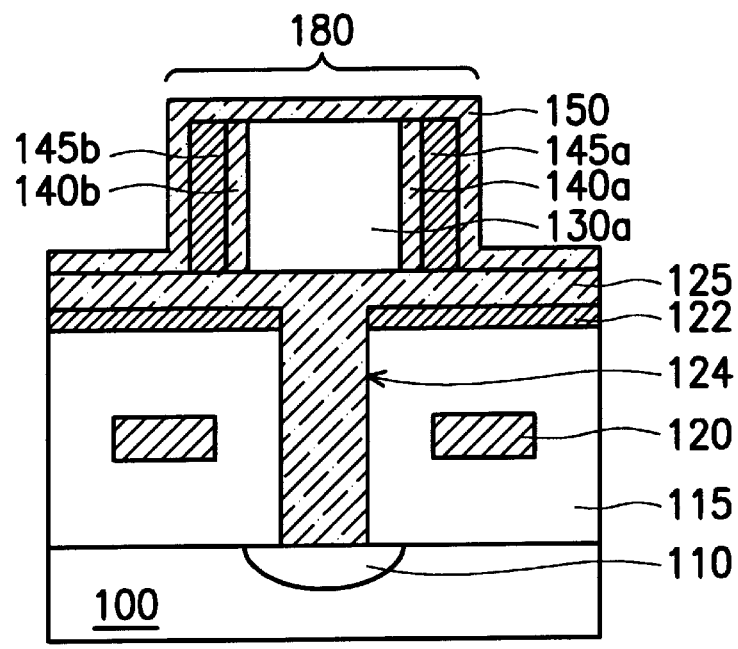
Figure 1H:
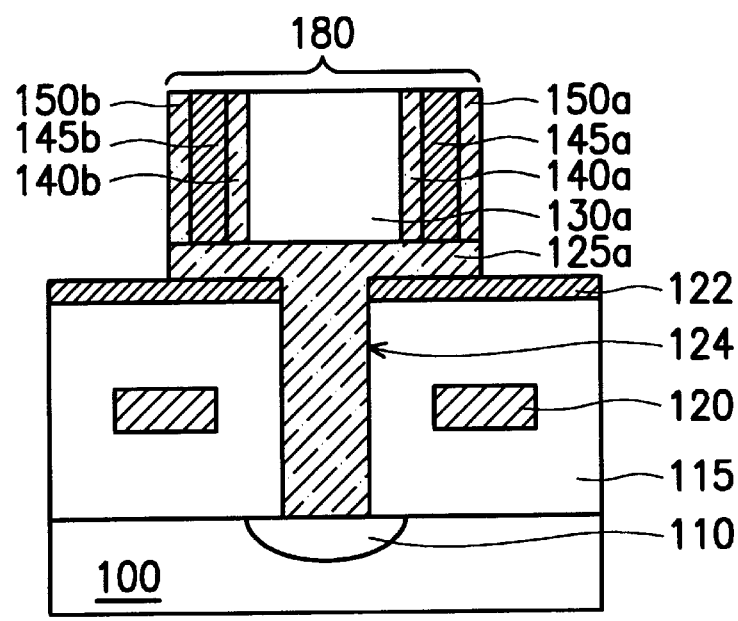
Figure 1I:
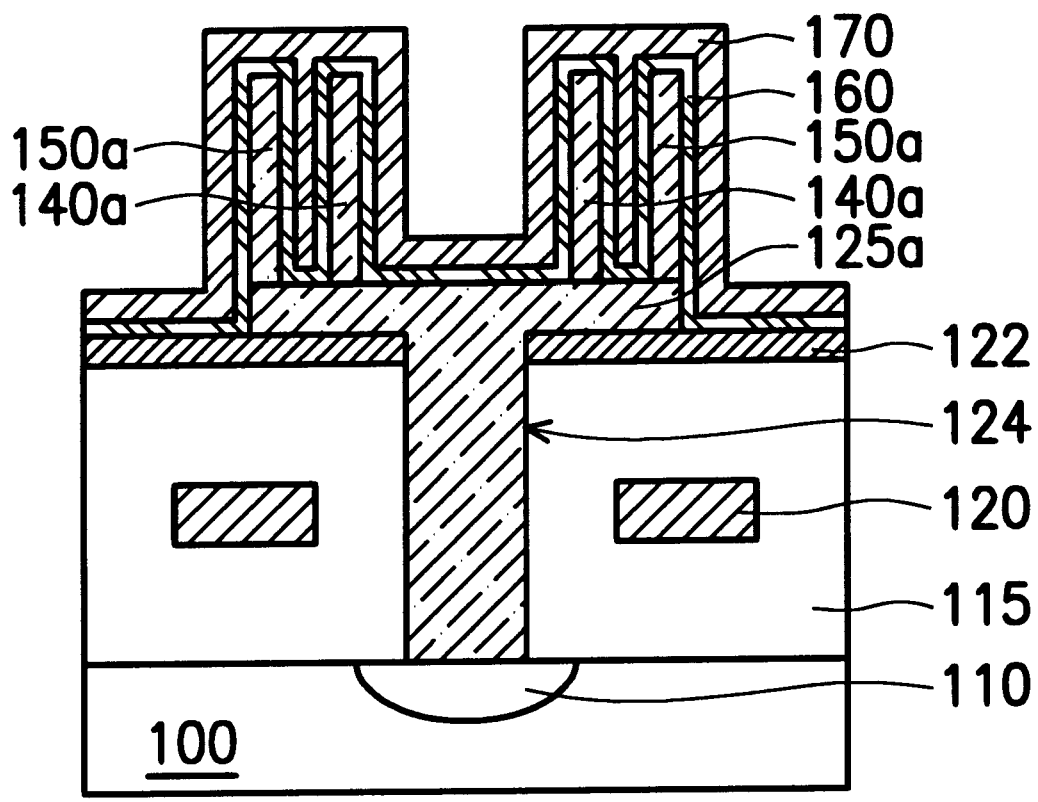

The invention disclosed herein is directed to a method of fabricating the stack crown capacitors of DRAMs. The drawing illustrates a partially completed integrated circuit device. In the following description, details are set forth in order to provide a thorough understanding of the present invention. It will be appreciated by those skilled in the art that variations of these specific details are possible while still achieving the results of the present invention. Well-known process steps are not described in detail in order to avoid unnecessarily obscuring the present invention.

Figure 2A:
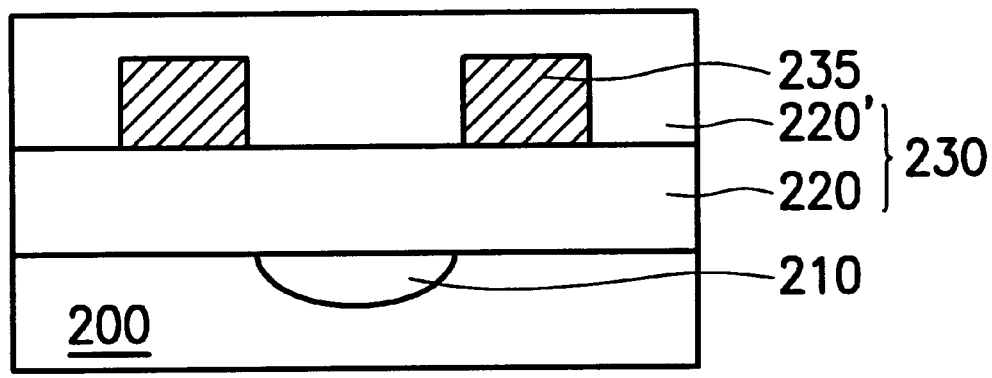
FIGS. 2A through 2L show schematic cross-sectional views of a partially fabricated integrated circuit structure at successive stages in forming a crown capacitor of a DRAM cell according to an embodiment of the present invention.

Referring now to FIG. 2A, the device area of a partially completed Metal-Oxide-Semiconductor Field Effect Transistor (MOSFET) is shown. A MOSFET region usually consists of a gate oxide, gate electrode, pad oxide, spacers, and diffusion areas such as source/drain regions. For simplicity, FIG. 2A only shows one of the source/drain regions 210, bit line 235 and insulating layer 220 and 220' of a MOSFET that is fabricated on a P-type semiconductor silicon substrate 200.

As shown in FIG. 2A, the insulating layer 220' is deposited over the insulating layer 220 and the bit line 235. The insulating layer 220' is usually using boronphosilicate glass (BPSG) which is formed by atmosphere CVD (APCVD) technique under the following condition: the temperature is about 400° C., the pressure is about 1.0 torr, and the reactant gases are $Si(C_2H_5O)_4$, $N_2$ and TMB (Tri-Methyl-Borate). The thickness of the insulating layer 220' is about 3000 to 10000 Angstroms. Thereafter, the insulating layer 220' is planarized by thermal reflow, etchback or chemical mechanical polishing (CMP) techniques. Since the insulating layer 220 and the insulating layer 220' are composed of the same materials, these two insulating layers are combined as the first insulating layer 230.

Figure 2B:
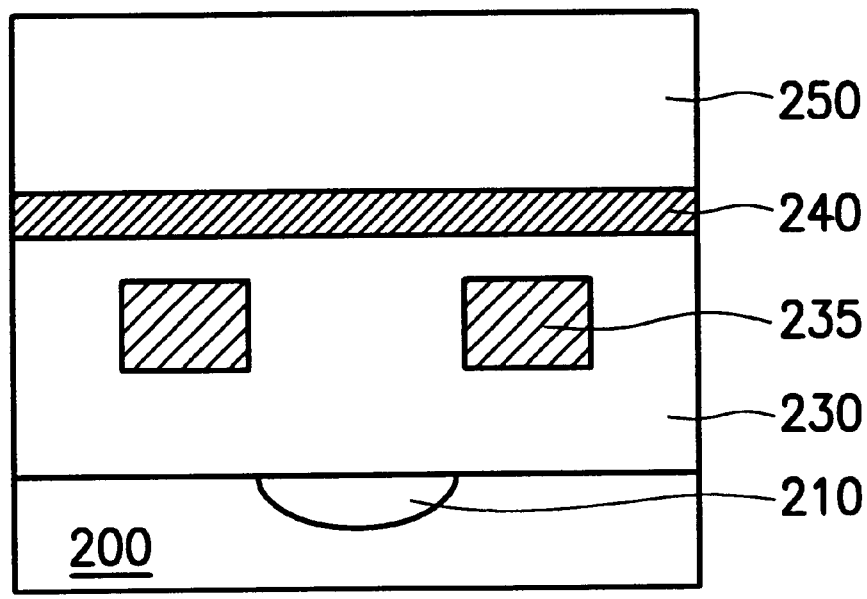

As shown in FIG. 2B, a first masking layer 240 is deposited over the first insulating layer 230. The first masking layer 240 usually uses Silicon Nitride and is formed by a Low Pressure CVD (LPCVD) technique. The thickness of the first masking layer 240 is about 100 to 3000 Angstroms. The first masking layer 240 is as an etching protection layer for preventing the bit line 235 from being damaged. A second insulating layer 250 is then deposited over the first masking layer 240. The material of the second insulating layer 250 is usually selected from BPSG, NSG (Non-doped Silicate Glass), HDP Oxide (High Density Plasma Oxide) or TEOS and is formed by using CVD, APCVD, LPCVD, PECVD or HDPCVD (High Density Plasma CVD) technique. The thickness of the second insulating layer 250 is about 1000 to 30000 Angstroms.

Figure 2C:
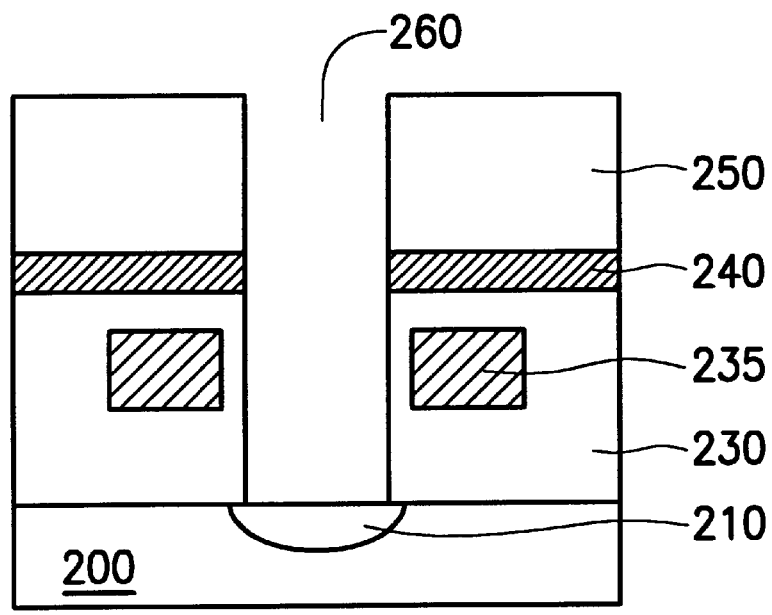

As shown in FIG. 2C, the second insulating layer 250, the first masking layer 240 and the first insulating layer 230 are patterned by using conventional photolithography processes and anisotropic etching to the surface of the diffusion areas, such as one of the source/drain regions 210, to form a contact hole 260.

Figure 2D:
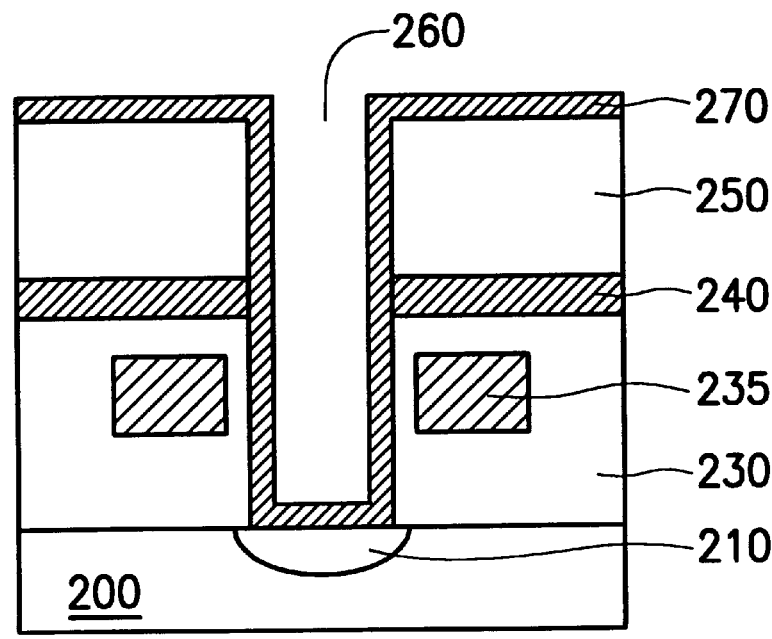

As shown in FIG. 2D, a second masking layer 270 is conformally formed over the surface of the second insulating layer 250 and extended to the sidewalls and the bottom of the contact hole 260. The second masking layer 270 such as Silicon Nitride is deposited by the Low Pressure CVD (LPCVD) technique. The thickness of the second masking layer 270 is about 50 to 1000 Angstroms.

Figure 2E:
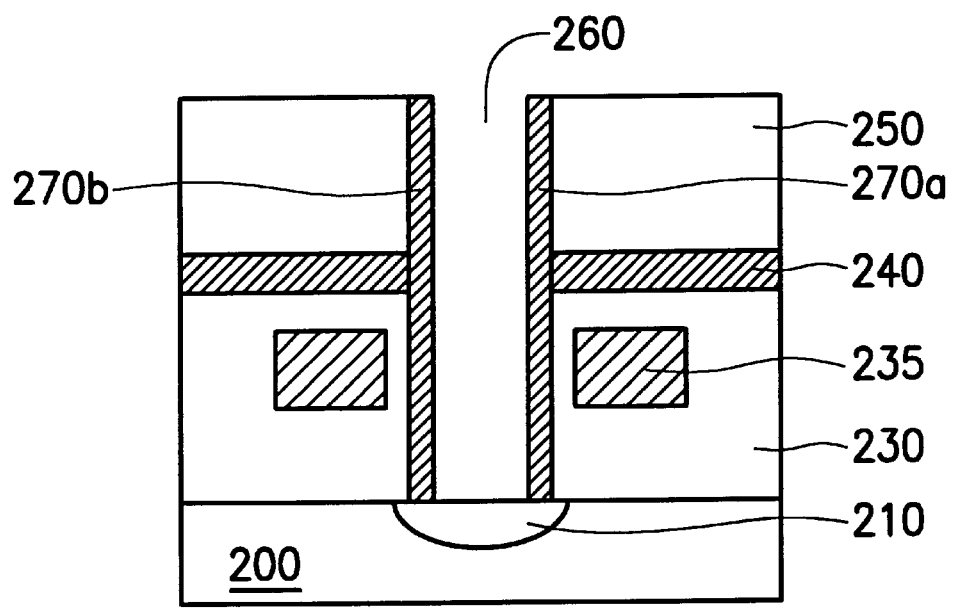

As shown in FIG. 2E, the second masking layer 270 is etched back to form masking spacer 270a and 270b on the sidewalls of the contact hole 260. Furthermore, the surface of diffusion areas 210 is revealed.

Figure 2F:
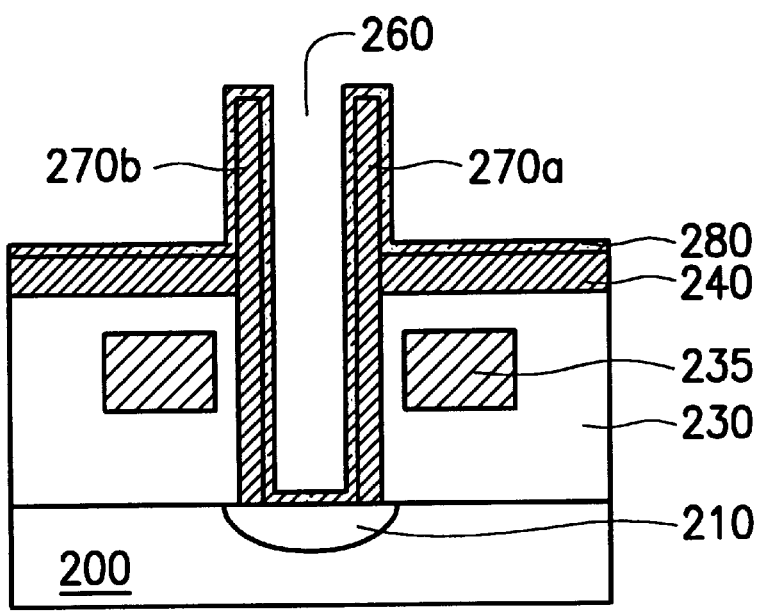

As shown in FIG. 2F, an isotropical wet etch process is used to remove the second insulating layer 250 over the masking layer 240. This step is one of the key processes of this invention. The masking spacers 270a and 270b and the masking layer 240 protect the bit line 235 from being damaged while wet etching. Thereafter, a first conductive layer 280 is conformally formed over the first masking layer 240, the bottom of the contact hole 260 and the masking spacers 270a and 270b. The conductive layer 280 will form the bottom storage electrode of the crown capacitor; as a result, the bottom storage electrode is not only above the first masking layer 240 but extends to the bottom of the contact hole 260. The surface area of the bottom storage electrode in this invention is much larger than the prior art. The thickness of the first conductive layer 280 is 100 to 3000 Angstroms. The first conductive layer 280 is usually composed of a material selected from the group consisting of polysilicon, metal Tungsten, Tungsten silicide and metal silicide. The first conductive layer 280 is formed by the Low Pressure CVD (LPCVD) technique. Another key point of this invention is that the masking layer 240 and the masking spacers 270a and 270b prevent the bit line 235 from shorting with the first conductive layer 280, even in case of misalignment.

Figure 2G:
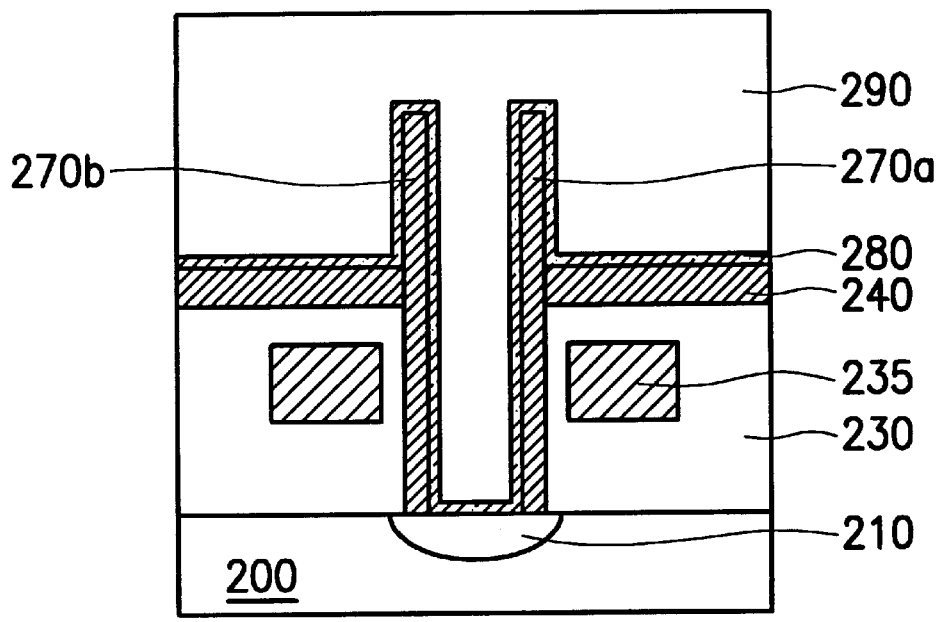

As shown in FIG. 2G, a third insulating layer 290 is formed over the first conductive layer 280 and fills the space of the contact hole 260. The material of the third insulating layer 290 is usually selected from BPSG, NSG (Non-doped Silicate Glass), HDP Oxide (High Density Plasma Oxide) or TEOS and is formed by using CVD-APCVD LPCVD PECVD or HDPCVD (High Density Plasma CVD) technique. The thickness of the third insulating layer 290 is about 1000 to 30000 Angstroms.

Figure 2H:
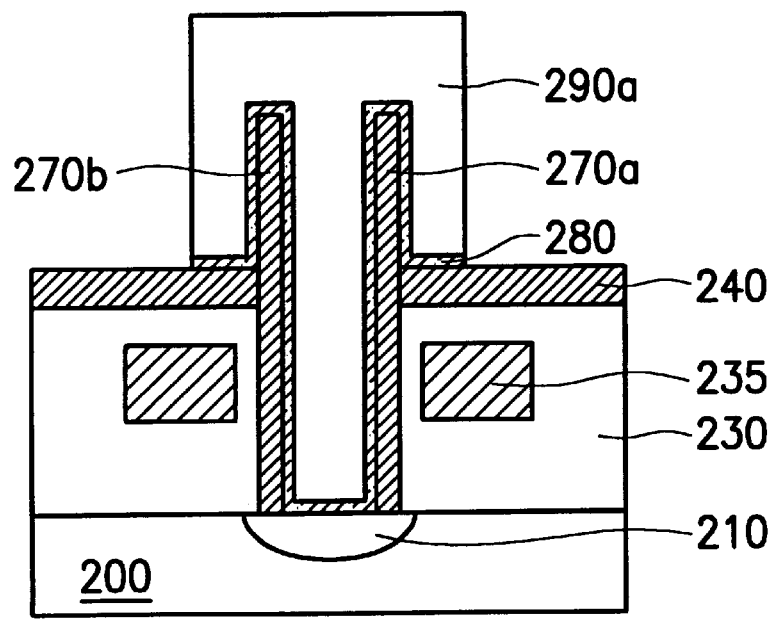

As shown in FIG. 2H, the third insulating layer 290 and the conductive layer 280 is then patterned leaving portions 290a having essentially vertical sidewalls over the contact hole 260. Conventional photolithographic techniques and anisotropic etching are used to pattern the third insulating layer 290 and the conductive layer 280 to the surface of the masking layer 240, as shown in FIG. 2H. For example, the plasma etching can be carried out by RIE or in a HDP etcher.

Figure 2I:
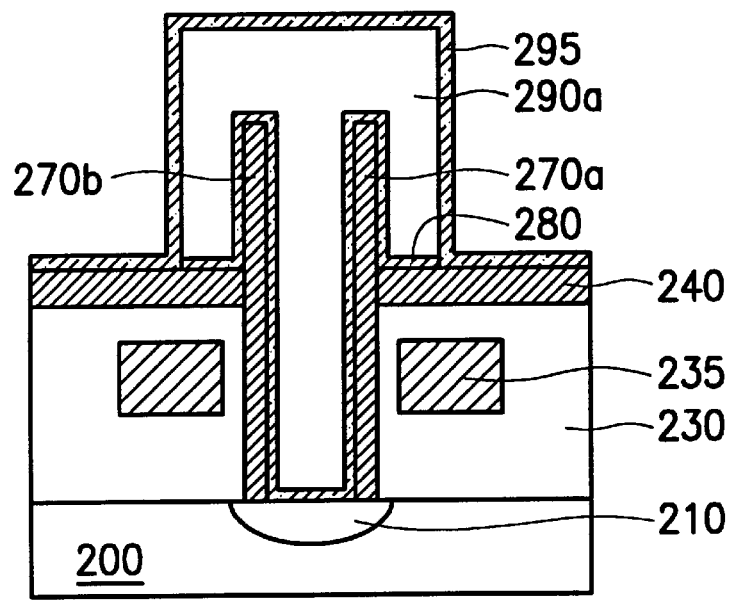

As shown in FIG. 2I, a second conductive layer 295 is then conformally formed over the patterned third insulating layer 290a and the masking layer 240. For example, the second conductive layer 295 is usually composed of the material selected from the group consisting of polysilicon, metal Tungsten, Tungsten silicide and metal silicide. The second conductive layer 295 is formed by LPCVD technique. The thickness of the second conductive layer 295 is 100 to 3000 Angstroms.

Figure 2J:
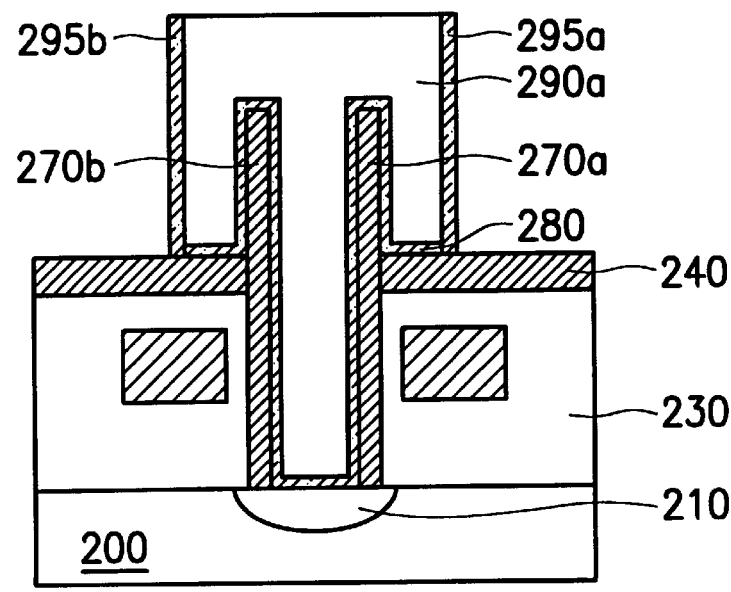

As shown in FIG. 2J, the second conductive layer 295 is anisotropically plasma etched back to form first conductive spacers 295a and 295b on the sidewalls of the patterned third insulating layer 290a and the conductive layer 280. The anisotropic etching is preferably carried out using RIE.

Figure 2K:
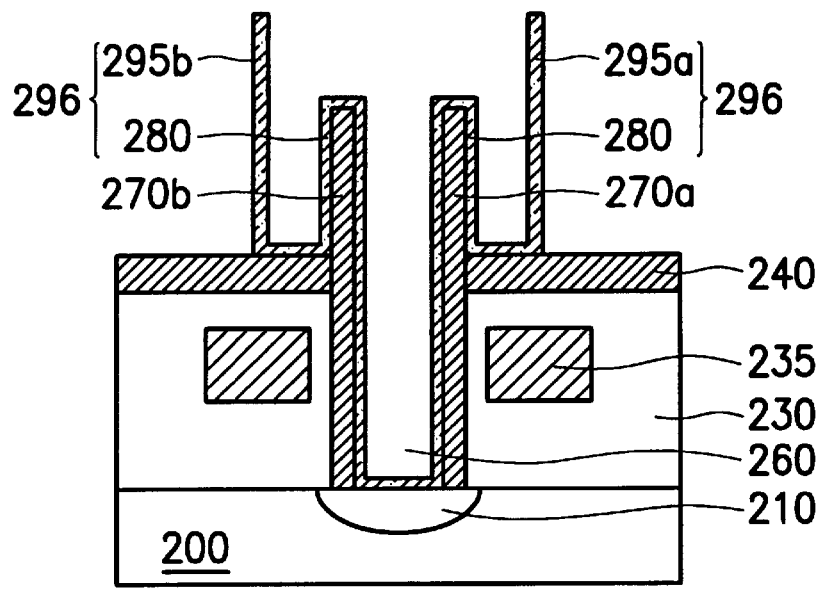

As shown in FIG. 2K, the third insulating layer 290a is then selectively removed by an isotropical wet etching to form a bottom electrode 296 having a double-crown shape formed from first conductive spacers 295a and 295b, and the conductive layer 280 that electrically connects the diffusion areas 210.

In this step, the masking spacers 270a and 270b and the masking layer 240 protect the bit line 235 from being damaged while wet etching.

Figure 2L:
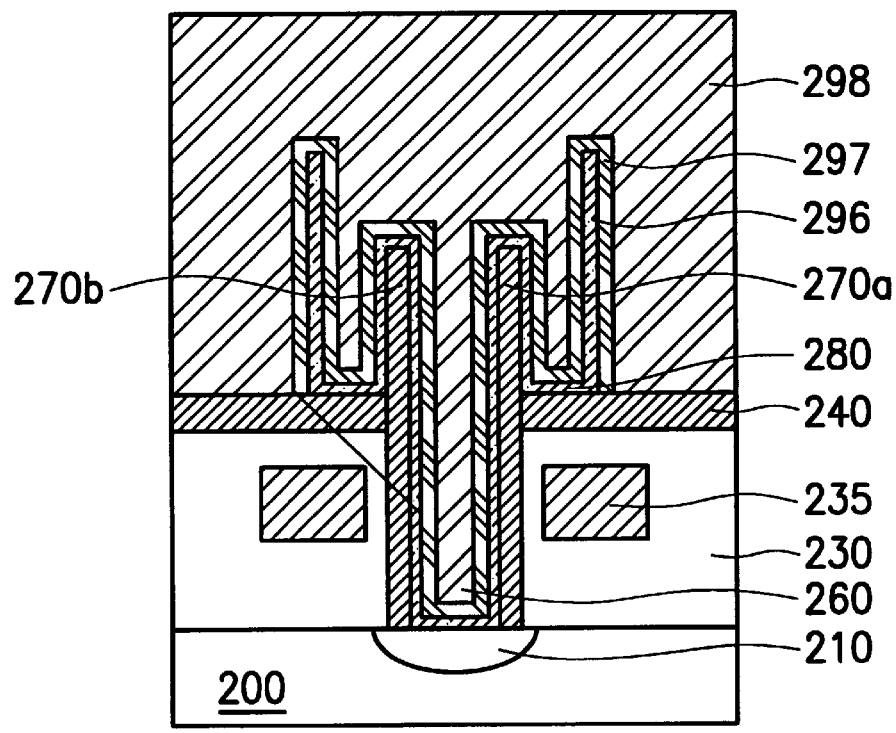

Then, referring to FIG. 2L, the stacked capacitor is now completed by forming a thin capacitor dielectric layer 297 on the bottom electrodes 296 composed of first conductive spacers 295a and 295b, and the conductive layer 280, and forming a top electrode from a conductive layer 298. Layer 297 is a high-dielectric-constant layer. This layer is typically composed of layers of $Si_3N_4/SiO_2$ (NO), or layers of $SiO_2/Si_3N_4/SiO_2$ (ONO). The conductive layer 298, for example a polysilicon material, is deposited by LPCVD using $SiH_4$, to a thickness of between about 1000 and 2000 Angstroms to be the top electrode.

It is to be understood that although the present invention has been described with reference to a particular preferred embodiment, it should be appreciated that numerous modifications, variations and adaptations may be made without departing from the scope of the invention as defined in the claims.

What is claimed is:

1. A method of fabricating a crown capacitor, comprising:
providing a semiconductor substrate having a transistor, comprising at least one diffused region, formed thereon and overlaid by a first insulating layer;
forming bit lines in the first insulating layer, wherein the first insulating layer isolates the bit lines and the substrate;
forming a first masking layer over the first insulating layer;
forming a second insulating layer over the first masking layer;
patterning the second insulating layer, the first masking layer and the first insulating layer to form a contact hole which exposes the diffused region;
conformally forming a second masking layer on the surface of the second insulating layer and extending to the sidewalls and the bottom of the contact hole;
etching back the second masking layer to form masking spacers on the sidewalls of the contact hole to prevent the bit lines from being damaged and shorting;
removing the second insulating layer;
conformally forming a first conductive layer over the first masking layer and extending to the surface of the masking spacers and the bottom of the contact hole;
forming a third insulating layer over the first conductive layer, wherein the third insulating layer fills the contact hole;
patterning the third insulating layer and the first conductive layer to the first masking layer leaving portions of the third insulating layer with vertical sidewalls over the contact hole;
forming a second conductive layer over the third insulating layer and the first masking layer;
etching back the second conductive layer to form conductive spacers on the sidewalls of the third insulating layer;
removing the third insulating layer to expose the conductive spacers and the first conductive layer as a bottom electrode;
forming a capacitor dielectric layer on the bottom electrode; and
forming a top electrode over the capacitor dielectric layer.

2. The method of claim 1, wherein the semiconductor substrate is a silicon substrate.

3. The method of claim 1, wherein the first conductive layer is composed of a material selected from the group consisting of polysilicon, metal Tungsten, Tungsten silicide and other metal silicide.

4. The method of claim 1, wherein the second conductive layer is composed of a material selected from the group consisting of polysilicon, metal Tungsten, Tungsten silicide and other metal silicide.

5. The method of claim 1, wherein the first masking layer is composed of silicon nitride.

6. The method of claim 1, wherein the first masking layer has a thickness of 100–3000 angstroms.

7. The method of claim 1, wherein the second masking layer has a thickness of 50–1000 angstroms.

8. The method of claim 1, wherein the second insulating layer has a thickness of 1000–30000 angstroms.

9. The method of claim 1, wherein the third insulating layer has a thickness of 1000–30000 angstroms.

10. The method of claim 1, wherein the first conductive layer has a thickness of 100–3000 angstroms.

11. The method of claim 1, wherein the second conductive layer has a thickness of 100–3000 angstroms.

12. The method of claim 1, wherein the second masking layer is composed of silicon nitride.

13. A method of fabricating a crown capacitor, comprising:

providing a substrate having a transistor, comprising at least one diffused region, formed thereon and overlaid by a first insulating layer;

forming bit lines in the first insulating layer, wherein the first insulating layer isolates the bit lines and the substrate;

forming a first silicon nitride layer over the first insulating layer;

forming a second insulating layer over the first silicon nitride layer;

patterning the second insulating layer, the first silicon nitride layer and the first insulating layer to form a contact hole which exposes the device areas;

forming a second silicon nitride layer on the surface of the second insulating layer and conformally extending to the sidewalls and the bottom of the contact hole;

etching back the second silicon nitride layer to form masking spacers on the sidewalls of the contact hole to prevent the bit lines from being damaged and shorting;

removing the second insulating layer;

conformally forming a first conductive layer over the first silicon nitride layer and extending to the surface of the masking spacers and the bottom of the contact hole;

forming a third insulating layer over the first conductive layer, wherein the third insulating layer fills the contact hole;

patterning the third insulating layer and the first conductive layer to the first silicon nitride layer leaving portions of the third insulating layer with vertical sidewalls over the contact hole;

forming a second conductive layer over the third insulating layer and the first silicon nitride layer;

etching back the second conductive layer to form conductive spacers on the sidewalls of the third insulating layer;

removing the third insulating layer to expose the conductive spacers and the first conductive layer as a bottom electrode;

forming a capacitor dielectric layer on the bottom electrode; and forming a top electrode over the capacitor dielectric layer.

14. The method of claim 13, wherein the first conductive layer is composed of a material selected from the group consisting of polysilicon, metal Tungsten, Tungsten silicide and other metal silicide.

15. The method of claim 13, wherein the second conductive layer is composed of a material selected from the group consisting of polysilicon, metal Tungsten, Tungsten silicide and other metal silicide.

16. The method of claim 13, wherein the first silicon nitride layer is deposited by LPCVD.

17. The method of claim 13, wherein the second silicon nitride layer is deposited by LPCVD.

18. The method of claim 13, wherein the first silicon nitride layer has a thickness of 100–3000 angstroms.

19. The method of claim 13, wherein the second silicon nitride layer has a thickness of 50–1000 angstroms.

20. The method of claim 13, wherein the second insulating layer has a thickness of 1000–30000 angstroms.

21. The method of claim 13, wherein the third insulating layer has a thickness of 1000–30000 angstroms.

22. The method of claim 13, wherein the first conductive layer has a thickness of 100–3000 angstroms.

23. The method of claim 13, wherein the second conductive layer has a thickness of 100–3000 angstroms.

* * * * *